United States Patent [19]

Cooper

[11] Patent Number: 4,564,843
[45] Date of Patent: Jan. 14, 1986

[54] ANTENNA WITH P.I.N. DIODE SWITCHED TUNING INDUCTORS

[76] Inventor: Charles E. Cooper, "Shannon", The Green, Cookham Dean, Berkshire, United Kingdom

[21] Appl. No.: 326,426

[22] Filed: Dec. 1, 1981

[30] Foreign Application Priority Data

Jun. 18, 1981 [GB] United Kingdom ............... 8118835

[51] Int. Cl.⁴ ............................................. H01Q 9/00
[52] U.S. Cl. ..................................... 343/745; 343/750
[58] Field of Search ............... 343/750, 749, 895, 876, 343/745, 747, 802; 455/121, 123, 193, 129, 120

[56] References Cited

U.S. PATENT DOCUMENTS

| | | | |
|---|---|---|---|
| 3,129,386 | 4/1964 | Daly | 343/749 |
| 3,414,833 | 12/1968 | Tolliver | 455/123 |
| 3,541,450 | 11/1970 | Paine | 343/895 |
| 3,852,759 | 12/1974 | Felsenheld et al. | 343/895 |
| 3,906,514 | 9/1975 | Phelan | 343/895 |
| 3,909,830 | 9/1975 | Campbell | 343/745 |
| 3,925,784 | 12/1975 | Phelan | 343/895 |
| 4,201,960 | 5/1980 | Skutta et al. | 455/123 |
| 4,201,990 | 5/1980 | Altmayer | 343/750 |
| 4,343,001 | 8/1982 | Anderson et al. | 343/745 |

FOREIGN PATENT DOCUMENTS 1202253 8/1970 United Kingdom .
1300635 12/1972 United Kingdom .
1407575 9/1975 United Kingdom .

OTHER PUBLICATIONS

Hiller, "Discrete PIN Diodes Toggle UHF Switches", Microwaves, V. 19, No. 8, (pp. 58–60, 63–65).

Primary Examiner—Eli Lieberman
Assistant Examiner—Michael C. Wimer
Attorney, Agent, or Firm—Roylance, Abrams, Berdo & Goodman

[57] ABSTRACT

A tuned radio antenna for a frequency agile communication system has a plurality of tuning inductors in series with a short-circuiting switch for each inductor, each switch being formed by a pair or a plurality of pairs of P.I.N. diodes, control means being provided for applying biasing potentials to the diodes to effect switching of the antenna tuning.

8 Claims, 3 Drawing Figures

ANTENNA WITH P.I.N. DIODE SWITCHED TUNING INDUCTORS

BACKGROUND OF THE INVENTION

1. Field of the Invention

This invention relates to tuned radio antennae finding particular application for a frequency agile radio system and/or for the achievement of improved power efficiency relative to broad-banded antennae with similar dimensions.

2. Prior Art

Many modern radio communication systems, particularly military systems, make use of "frequency agility" technique in which the radio frequency is repetitively changed. The rate of change may typically be at rates up to 1000 per second and it is common to use a large number of frequencies over a wide band. It may be required for example to effect switching between any of the frequencies in the military UHF band or between any of the frequencies in the "tactical VHF" band. It has heretofore generally been the practice to make use of wide band antennae for this purpose. Although many designs for broad banded antennae are well-known, this requirement for operation over a very broad band normally imposes limitations in the power efficiency and/or the voltage standing wave ratio limit, particularly in the tactical VHF band. It has to be borne in mind that antenna design commonly has to be a compromise between a number of diverse requirements, including size, radiation pattern etc.

Heretofore it has not been considered possible to effect switching to tune the antenna to each frequency at the very high switching speeds required with modern frequency agility systems. Tuning of antennae to effect switching is well-known. The Paper by C E Cooper "Airborne Low VHF Antennas" delivered at the 26th Agard Meeting in Munich, November 1973, describes an airborne antenna with a VHF radiator of the capacitive type with six inductances for tuning purposes, which inductances can be short-circuited by vacuum relay switches. The inductances have different magnitudes and by selective switching, tuning to a number of different frequencies is possible. Miniature high vacuum relays are available which have an operating time as short as 100 m.secs. but such relays would have only a very limited life if constantly switched even at only ten changeovers per second. In practice therefore mechanically switched antennae of this nature are not suitable for frequency agility systems.

BRIEF SUMMARY OF THE INVENTION

It is an object of the present invention to provide an improved form of antenna enabling rapid frequency switching to be effected so as to enable the antenna to be re-tuned as required in synchronism with the frequency hopping of a frequency agile communication system.

According to the present invention, a radio antenna comprises a capacitive radiating/receiving element with a plurality of discrete tuning inductors in series, each inductor having a short-circuiting switch, and wherein each switch comprises two or more P.I.N. diodes arranged for switchably short-circuiting the associated inductor or a part thereof.

In the above construction, a switch for a discrete inductor might comprise two P.I.N. diodes connected back-to-back with means for applying a switching potential to their common junction. In some cases however an inductor may be divided into two or more parts with separate switches for each part. Each switch might comprise two groups of P.I.N. diodes, the diodes in each group being connected in series anode to cathode so as to be conductive in one direction and the two groups being connected in series with opposite polarities, the switching potential being applied to the junction of the two groups.

The switches, in this construction, are in a high impedance circuit. By the arrangement described however, the high voltages associated with such a circuit are divided and it becomes possible to utilise P.I.N. diodes without need for comparably-high reverse-bias voltages, and it is thereby possible to obtain the very high speed switching such as might be required for a frequency agile communication system.

The inductors conveniently are formed as discrete printed circuit elements, e.g. of spiral form.

The use of six inductors, if they are of appropriate different magnitudes, enables a total of 64 switching combinations to be obtained. Preferably the inductors have magnitudes increasing in steps, with each successive inductor having a magnitude twice that of the next smaller one. Minor departures from a true binary relationship may be necessary because of circuit stray capacitances and mutual inductance between the separate inductors.

P.I.N. type diodes are used for switching because of their charge storage capability. A moderate DC biasing current can hold such a diode conductive throughout the time cycle of an RF current of magnitude far greater than the bias. The storage capability of a particular diode type determines the longest half cycle time and hence the lowest frequency of current for which conductivity remains fully effective during the inverse half cycle, that is to say the half cycle where the radio frequency current opposes the smaller DC bias current. However with present-day available P.I.N. type diodes, the charge storage capability readily permits of their use for an antenna as decribed above for operating in the UHF or VHF band.

Maintenance of the conductive condition depends on the average magnitude of the diode current. In the non-conductive condition, with no current or negligible current, there can be no charge storage. In this condition therefore other means have to be provided to maintain non-conductivity during those half cycles when the RF signal is attempting to forward bias the diodes into conductivity. The obvious way of maintaining non-conductivity when so required (that is in order to leave an inductor effectively in circuit) is to reverse bias the diode by a DC voltage of magnitude at least equal to the peak value of the RF voltage appearing across the coil and its shunt diode. In some cases, for even moderate power radio transmitters, full reverse bias voltage may be inconveniently high for one diode. It is for this reason therefore that a plurality of diodes may be employed in each switch. It may be necessary to accept some current flow upon peaks of the radio frequency voltage, this flow being limited by self-rectification producing accumulating reverse bias and, for this reason, it may be preferred to provide capacitance (discrete or stray) associated with the diode feed circuitry to tend to maintain the required bias. The provision of this capacitance may be effected by using metal plates acting also as heat sinks for the diode switches.

DESCRIPTION OF PREFERRED EMBODIMENTS

Figure 1:
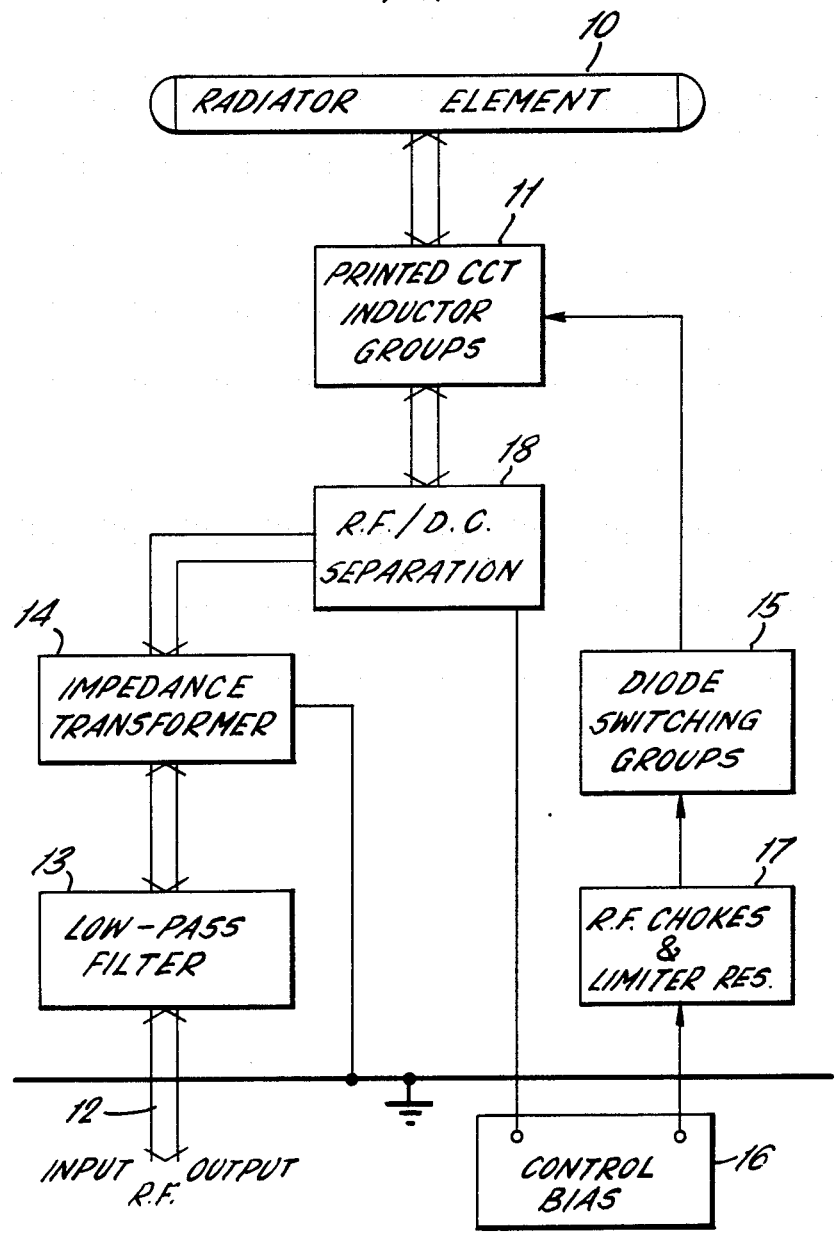
FIG. 1 is a block diagram illustrating a unipole tuned capacitive antenna system.

Referring to FIG. 1 there is shown a unipole antenna system with a capacitive radiating element 10. For an aircraft aerial this may typically be a mesh plate which might be moulded into a suitably shaped shell, e.g. of resin-bonded fibre construction. It might typically have a radiating capacitance to ground of some 15 pf and hence would require a series inductance of 1.8 microhenries in order to resonate at 30 MHz. The tuning is effected by series inductors 11 on a printed circuit. Connection to a radio frequency input/output is effected via a line 12 of 50 ohms impedance with a low pass filter 13 to remove unwanted higher frequency signals and a ferrite cored impedance transformer 14. These components will be described in further detail later with reference to FIG. 2. Also to be described later is the diode switching arrangement effected by diode switching groups 15 which are controlled by a controller 16 applying control bias via radio frequency choking and limiter circuit 17 and a suitable RF/DC separation circuit 18.

Figure 2:
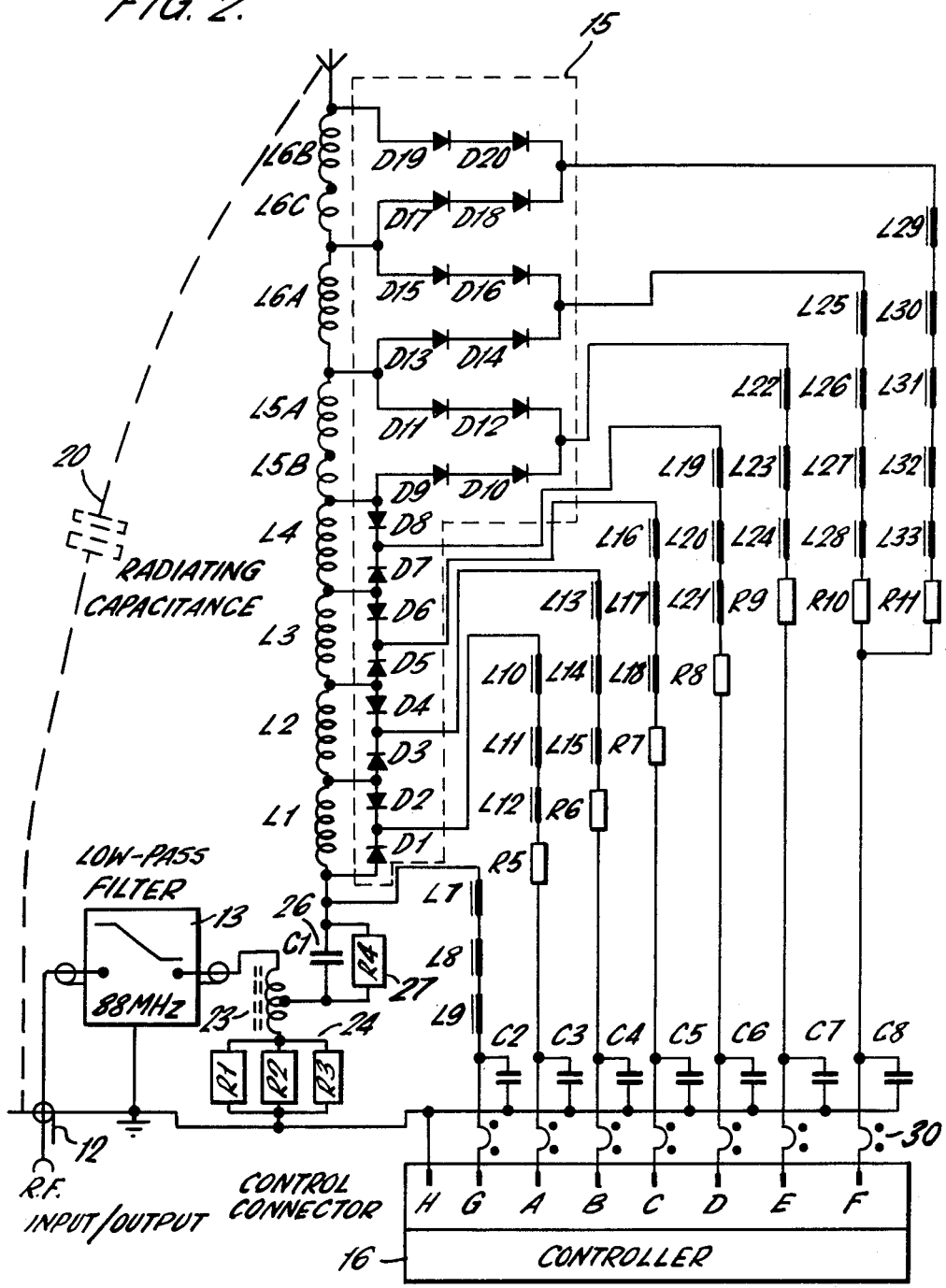
FIG. 2 is a diagram showing in further detail part of the circuit arrangement of FIG. 1.

Referring to FIG. 2 the radiating capacitance is shown diagrammatically by the dashed line 20. The series inductors comprise six inductors L1 to L6 of which the largest but one inductor L5 is divided into two parts L5A and L5B and the largest inductor L6 is divided into two parts L6A, L6B together with a discrete trimming inductor L6C. The impedance transformer 14 of FIG. 1 is shown in FIG. 2 as a ferrite cored coil 23 with the antenna input connected to a tap on the coil, one end of which is connected to the low pass filter 13 and the other end of which is connected via resistors 24 to ground. The radio frequency DC separation circuit includes a capacitor 26 shunted by a resistor 27.

The junction between the capacitor and the series inductors is connected via radio frequency choking inductances L7, L8 and L9 to one terminal G of the controller 16. The three chokes in series have different self-resonant frequencies. This terminal is shunted to ground via a capacitor C2 constituting the DC bias storage capacitor. The inductor L1 is shunted by two switching diodes D1, D2, these being P.I.N. diodes connected back-to-back with their junction connected via RF chokes L10, L11 and L12 and a resistor R5 to a terminal A on the control unit and also via capacitor C3 to ground. Similarly inductors L2, L3 and L4 have their associated pairs of P.I.N. diodes D3,D4; D5,D6; and D7,D8, respectively. The junctions of the two diodes in each pair are connected via an associated RF choke and resistor circuit (e.g. L10, L11 and L12 tuned to different self resonant frequencies and resistor R5 to restrict forward bias current) to control terminals B, C and D in the control unit 16 and having associated capacitors C4, C5 and C6.

The inductor L5 is switched by means of four P.I.N. diodes D9, D10, D11, D12 connected in series, the diodes D9, D10 being connected together in series for conduction in one direction and in series with the diodes D11, D12 for conduction in the opposite direction. The junction of the two groups of diodes is connected via RF chokes and a resistor to terminal E. For inductor L6, the portion L6A is shunted by diodes D13 to D16 arranged similarly to the diodes D9 to D12 whilst the inductors L6B, L6C are shunted by diodes D17 to D20, again arranged similarly to the diodes D9 to D12, these separate sets of diodes having separate switching circuits but with all the diodes D13 to D20 connected to a single control terminal F.

The six inductors L1 to L6 have magnitudes in a binary series and the associated switches thus provide 64 possible different tuning conditions for the antenna.

The controller 16 provides a low voltage/high current for forward bias of diodes to be maintained conductive and an inverted polarlity of higher voltage/low current for biasing diodes to be non-conductive. The reverse bias should ideally be a DC voltage of magnitude at least equal to the peak value of the RF voltage appearing across the inductor and its shunt diode. In practice, when the antenna is used for transmitting, it may be necessary to accept some current flow upon peaks of the RF voltage, this flow being limited to self-rectification then accumulating reverse bias which is briefly stored in the capacitance associated with the diode feed circuitry. The use of groups of diodes switched in unison divides the RF voltage. Further voltage division is obtained by dividing the higher magnitude inductors.

The common feed chain L7, L8, L9, in conjunction with capacitor C1 and shunt resistor R4 ensure that all radio frequency current flows to ground through the transformer winding without that component being required to carry any significant DC bias current. The individual choke series for each switch is formed of three separate chokes as described above having different self resonant frequencies. In series with the chokes for each switch is a resistor (R5 to R11) to restrict forward bias current to the chosen value. The common bias feed in each of the six individual bias feeds all incorporate a ferrite bead 30 and capacitances to ground C2 to C8 respectively; these components constitute an RF filter and so prevent stray radio frequency current or pick-up from being transferred into the bias feed circuit.

The ferrite cored transformer 23 has its turns ratio such as to provide impedance matching between the 50 ohm line and the total of the radiation plus loss resistance of the antenna. This matching ratio might be switched, e.g. with switching diodes, in unison with the tuning control but it has been found in practice that a fixed ratio is satisfactory.

Figure 3:
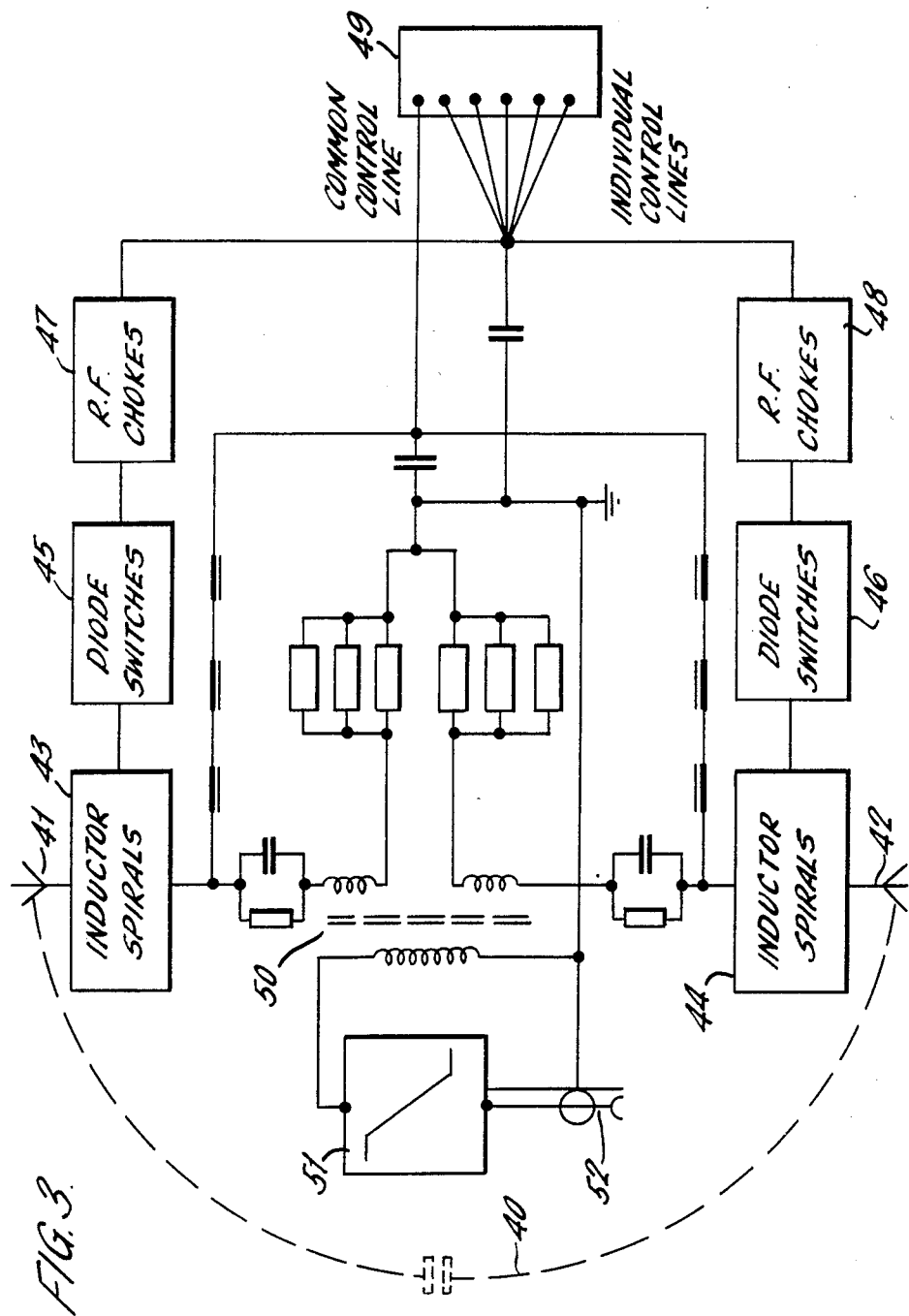
FIG. 3 is a block diagram illustrating a dipole antenna system.

FIG. 3 illustrates a capacitive dipole antenna system in which the radiating capacitance is indicated by the dashed lines 40 between capacitive elements 41, 42. Each of these capacitive elements has its associated series inductor spirals 43, 44 controlled by diode switches 45, 46 respectively. The diode switches have associated radio frequency choke circuits 47, 48 connected to a control unit 49. This control unit may be generally similar to that described with reference to FIG. 2. The inductor spirals are connected via RF/DC separation circuits to a common matching transformer 50 and low pass filter 51 leading to the radio frequency input/output 52.

The manner of operation of the dipole circuit of FIG. 3 is generally similar to that of the unipole circuit of FIG. 2.

Although particularly directed at communication systems where high speed re-tune switching is needed to associate with frequency agility, the methods of antenna tuning and tuning switching as described herein also have advantages of size, weight and reliability and the achievement of high power-efficiency in systems where only moderate speed of re-tune is needed.

While the invention has been described in detail above, it is to be understood that this detailed description is by way of example only, and the protection granted is to be limited only within the spirit of the invention and the scope of the following claims.

I claim:

1. A radio antenna for frequency agile operation at a plurality of frequencies in a predetermined frequency band, comprising:
   a capacitive radiating/receiving element;
   a plurality of discrete tuning inductors coupled in series with said radiating/receiving element, said inductors having different inductances and having a short-circuiting switch, each said short-circuiting switch including at least two P.I.N. diodes arranged for switchably short-circuiting at least a part of the respective inductor;
   controller means coupled to said switches, for sequentially changing the tuning of the antenna by selectively applying a forward bias to said diodes to be maintained conductive and a reverse bias to said diodes to be maintained non-conductive; and
   at least one of said inductors being divided into a plurality of parts having separate switches for each of said parts.

2. An antenna according to claim 1, wherein a capacitance is associated with each said switch tending to maintain an applied bias on each said switch.

3. A radio antenna for frequency agile operation at a plurality of frequencies in a predetermined frequency band, comprising:
   a capacitive radiating/receiving element;
   a plurality of discrete tuning inductors coupled in series with said radiating/receiving element, said inductors having different inductances and having a short-circuiting switch, each said short-circuiting switch including at least two P.I.N. diodes arranged for switchably short-circuiting at least a part of the respective inductor;
   controller means coupled to said switches, for sequentially changing the tuning of the antenna by selectively applying a forward bias to said diodes to be maintained conductive and a reverse bias to said diodes to be maintained non-conductive; and
   said inductor inductances increasing in steps with each successive inductor having an inductance substantially twice that of the next smaller inductor.

4. An antenna according to claim 3, wherein a capacitance is associated with each said switch tending to maintain an applied bias on each said switch.

5. A radio antenna for frequency agile operation at a plurality of frequencies in a predetermined frequency band, comprising:
   a capacitive radiating/receiving element;
   a plurality of discrete tuning inductors coupled in series with said radiating/receiving element, said inductors having different inductances and having a short-circuiting switch, each said short-circuiting switch including at least two P.I.N. diodes arranged for switchably short-circuiting at least a part of the respective inductor;
   controller means coupled to said switches, for sequentially changing the tuning of the antenna by selectively applying a forward bias to said diodes to be maintained conductive and a reverse bias to said diodes to be maintained non-conductive; and
   said diodes for each of said discrete inductors being connected back-to-back with a common junction therebetween and having a charge storage capacity; and
   wherein said controller means is coupled for applying a biasing current to said common junctions for forward biasing of each said switches, said biasing current having a magnitude such that said charge storage capacity of each said diode holds each said diode conductive throughout a cycle of any radio frequency within the predetermined frequency band.

6. An antenna according to claim 5, wherein a capacitance is associated with each said switch tending to maintain an applied bias on each said switch.

7. A radio antenna for frequency agile operation at a plurality of frequencies in a predetermined frequency band, comprising:
   a capacitive radiating/receiving element;
   a plurality of discrete tuning inductors coupled in series with said radiating/receiving element, said inductors having different inductances and having a short-circuiting switch, each said short-circuiting switch including at least two P.I.N. diodes arranged for switchably short-circuiting at least a part of the respective inductor;
   controller means coupled to said switches, for sequentially changing the tuning of the antenna by selectively applying a forward bias to said diodes to be maintained conductive and a reverse bias to said diodes to be maintained non-conductive;
   wherein said switch for at least one of said discrete inductors comprises two groups of said P.I.N. diodes arranged for simultaneously switchably short circuiting respective parts of the inductor, each of said groups including two P.I.N. diodes connected back-to-back with a common junction therebetween, each of said diodes having a charge storage capacity; and
   wherein said controller means is coupled for applying a biasing current to said common junctions for forward biasing of each said switch; said biasing current having a magnitude such that said charge storage capacity of each said diode holds each said diode conductive throughout a cycle of any radio frequency within the predetermined frequency band.

8. An antenna according to claim 7, wherein a capacitance is associated with each said switch tending to maintain an applied bias on each said switch.

* * * * *